United States Patent [19]

Afzali-Ardakani et al.

[11] Patent Number: 5,776,370
[45] Date of Patent: Jul. 7, 1998

[54] CHARGE TRANSFER COMPLEXES BETWEEN POLYANILINE AND ORGANIC ELECTRON ACCEPTORS AND METHOD OF FABRICATION

[75] Inventors: Ali Afzali-Ardakani, Yorktown Heights; Stephen Leslie Buchwalter, Hopewell Junction, both of N.Y.

[73] Assignee: International Business Machines Corporation, Armonk, N.Y.

[21] Appl. No.: 637,993

[22] Filed: Apr. 25, 1996

[51] Int. Cl.$^6$ .............................. H01B 1/00; H01B 1/20; C08J 5/00; C08K 5/04
[52] U.S. Cl. .............................. 252/500; 528/422; 524/108
[58] Field of Search .............................. 252/500, 518.1; 528/422; 524/80, 108, 186, 913; 264/340

[56] References Cited

U.S. PATENT DOCUMENTS

| | | | |
|---|---|---|---|
| 4,615,829 | 10/1986 | Tamura et al. | 252/500 |
| 5,378,403 | 1/1995 | Shacklette | 252/500 |
| 5,427,715 | 6/1995 | Ohwe et al. | 252/500 |
| 5,520,852 | 5/1996 | Ikkala et al. | 252/521 |

OTHER PUBLICATIONS

Tanaka et al "Doping effect of C60 on soluble polyaniline" *Synth. Met.*, 66(2), 1994, pp. 193–196. (No month) (Abstract Only).

Neoh et al "Synthesis and Characterization of Electrically Conducting Polyaniline–TCNE Complexes" *Jour. of Polymer Sci. Part A*, vol. 27, 1989, pp. 4365–4374. (No month).

Kang et al "X.p.s. Studies of charge transfer interactions in some polyaniline complexes", *Polymer*, vol. 31, Feb. 1990 pp. 202–207.

"Automatic Doping of Polyaniline with Organic Electron Acceptors", T. Ohsawa, H. Nishihara, K. Aramaki and K. Yoshino, R&D Center, Ricoh Co. Ltd., Yokohama 223 (Japan), *Chemistry Lett*, 1991, pp. 1707–1710.

"Non–Linear Electric Properties of Polyaniline Doped with Organic Acceptors", T. Ohsawa, T. Kabata, O. Kimura, S. Nakajima, R&D Center, Ricoh Co. Ltd. Yokohama (Japan) Synthetic Metals, 55–57, 1993 pp. 4842–4847.

"Corrosion Resistant Coating from Conducting Polymers". D.A. Wrobleski and B.C. Benicewicz, Polymers and Coatings Group, Materials Div., Los Alamos National Laboratory, Los Alamos, NM 87545 Polymer Preprints (Am. Chem. Soc), 35, 1994 pp. 265–266.

"Preparation and Conductivities of Fullerene–doped Polyanilines", Y. Wei, J. Tian, A.G. MacDiarmid, J.G. Masters, A.L. Smith and D. Li, J. Chem. Soc., Chem. Commun., 1993, pp. 603–604.

*Primary Examiner*—Mark Kopec
*Attorney, Agent, or Firm*—Scully, Scott, Murphy & Presser

[57] ABSTRACT

Disclosed are charge transfer complexes based on a polyaniline in combination with an organic electron electron acceptor. The resulting conductive polymer possesses enhanced electrical, thermal and solubility properties over known conductive polymers. Also disclosed is a charge transfer based composition of matter whose electrical conductivity, chemical and physical properties are further enhanced by doping with protonic acid. The composition is prepared by a simple method and has widespread application in the printed circuit field, and in various other devices.

11 Claims, 3 Drawing Sheets

FIG.2
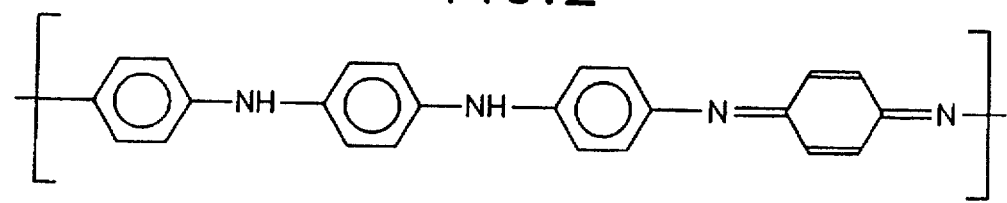
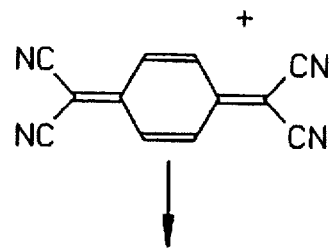
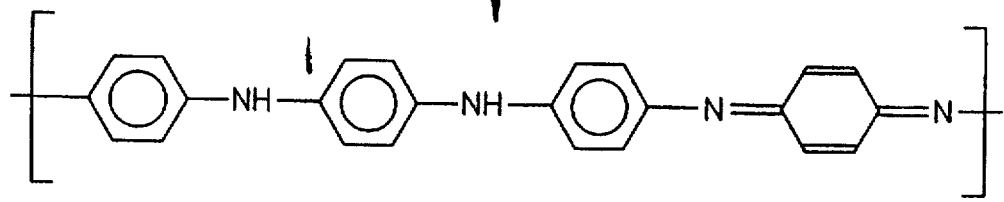
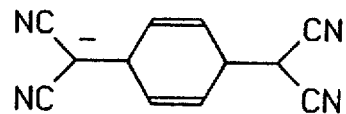

CHARGE TRANSFER COMPLEXES BETWEEN POLYANILINE AND ORGANIC ELECTRON ACCEPTORS AND METHOD OF FABRICATION

BACKGROUND OF THE INVENTION

1. Field of the Invention

This invention is related to the field of polymer chemistry. In particular, this invention is related to the field of electrically conductive polymers, specially that of polyaniline. This invention further relates to charge transfer complexes formed between polyaniline emeraldine base and organic electron acceptors which, alone or further doped with protonic acids, result in a conductive polymer product having improved electrical and thermal properties.

2. Background Art

Polymers having electrical conductivity are known in the art, having been of scientific and technological interest since the late 1970's. These polymer materials exhibit some of the electronic and magnetic properties approaching those characteristic of metals, while retaining mechanical and thermal properties associated with conventional polymers. Among the various electrically conductive polymers, polyaniline (PANI) has attracted most attention, due to moderate environmental stability in its doped, electrically conductive form.

Also known is a process for enhancing the electrical conductivity of polyaniline by exposure to dopants, such as by acid doping of the polymer. However, using the known processes and materials to prepare a conductive PANI can result in a problematic situation in which such dopants, especially monomeric dopants, including acid dopants, diffuse out of the polymer into a number of common solvents, degrading the conductivity of the polymeric material. It is suggested that the N—H bond in the polymer is very labile, so that base, such as alkali solution, or water or other common solvents can easily abstract the proton and return the material to a non-conducting state. In addition, the polymer so doped can, upon heating, degrade with respect to its electrical properties such that the doped polymer performs unreliably in long term, or even short term, normal use in electronic devices, such as diodes, FETs, batteries, and in ESC and EMI protection. Up to the present invention, for example, none of the known conducting, doped polyaniline derivatives will long survive temperatures exceeding about 200 degrees C., whereas the nonconducting, undoped form of the polyaniline derivatives is thermally stable to temperature above about 400 degrees C. It is suggested that the thermal stability of known doped polymeric materials is limited by the volatility of the acid dopant used.

It should be noted that "doping" as a term used in the present art indicates the incorporation of more than just a minute trace of the dopant. In the present art, doping generally means including an amount of dopant that can range from less than about 5% to about 50% per unit of the polymer.

A need remains for highly conductive polymers having improved stability in the presence of common solvents and at temperatures to which working electronic devices are likely to be exposed.

Ohsawa et al. on pp. 1707–1710 of *Chemistry Letters*, 1991 "Automatic Doping of Polyaniline with Organic Electron Acceptors" and Ohsawa et al. on pp. 4842–4847 of *Synthetic Metals*, 55–57 (1993) in "Non-linear Electric Properties of Polyaniline Doped with Organic Acceptors" discuss conductive properties of charge transfer complexes of completely reduced polyaniline (white PANI, also known as leucoemeraldine) combined with various organic electron acceptors. The conductivities of leucoemeraldine PANI-organic acceptors thus formed were reported to be in the range of about $10^{-2}$ to $10^{-7}$ S/cm. Also reported were the fabrication of field effect transistors using said charge transfer complexes.

On pages 265–266 of *Polymer Preprints* (*Am. Chem. Soc., Polymer Div.*), 35, 1994, in "Corrosion Resistant Coatings from Conducting Polymers", Wrobleski and Benicewicz of Los Alamos National Laboratory and Thompson and Coleman of NASA discuss alternatives to chromium for corrosion resistant coatings. They report the preparation of the emeraldine base (EB) of polyaniline, both undoped and variously doped, and its use under a polyurethane or an epoxy topcoat as a corrosion inhibitor on steel. The topcoated, doped EB polyaniline/tetracyanoethylene (TCNE) charge transfer complex, which is intensely colored, having conductivity of about $10^{-6}$ S/cm was used for corrosion inhibition of steel.

In yet another example of charge transfer complexes of polyaniline, Wei, MacDiarmid et al. (J. Chem. Soc. Chem. Comm. 1993, 603–604), describe the doping of EB PANI with fullerene, an allotrope of carbon which functions as an electron acceptor to form a charge transfer complex in certain polar solvents. The conductivity of the fullerene-doped polyaniline prepared in NMP solution has been reported to be in the order of $10^{-4}$ S/cm, far lower than acid-doped polyaniline.

The present invention presents novel doped EB PANI by formation of the charge-transfer complexes of the latter with a variety of organic electron acceptors. Contrary to the teaching of prior art, in which the totally reduced form of polyaniline (leucoemeraldine) is doped with organic electron acceptors resulting in polyaniline of very low conductivity (about $10^{-7}$ to about $10^{-5}$ S/cm); in this invention, the emeraldine base form of polyaniline, i.e. the half-oxidized and most stable form of PANI, is used as organic base, and is doped with a variety of organic electron accepting molecules. The CTC's thus formed could be doped further by protonic acids to give conductive polymers of high conductivity (10–15 S/cm) and thermal stability.

The composition of matter of the present invention has the added advantage of not being as intensely colored as previously reported CTC's of PANI, and yet more conductive. It is therefore useful to coat LED backing electrodes and other devices wherein at least partial transparency of the coating contributes to the utility of the device. Another advantage of the present invention over the reference of Wrobleski et al. is that EB PANI is doped at much faster rate.

SUMMARY OF THE INVENTION

Accordingly, it is an object of the invention to provide conductive polymers having enhanced electrical conductivity and other enhanced physical and chemical properties, such as thermal stability and resistance of the doped form to common solvents.

It is a further object of the invention to provide these conductive polymers involving charge transfer complexes comprising emeraldine base form of polyaniline.

Still another object of the invention is to further enhance the conductivity of these polymers, using organic electron acceptors.

Still another object of this invention is to further enhance the conductivity of such charge transfer complexes of polyaniline by treatment (doping) with protonic acids.

For example, a polymer of the present invention provides a conductivity increase of at least an order of magnitude over known acid-doped polyanilines, and its conductivity dose not decay either after extended periods of time or up to about 250 degrees C., or after extended periods of exposure to common solvents.

The foregoing and other objects and advantages are accomplished in the present invention by means of charge transfer complexes based on emeraldine base form of polyaniline and organic electron acceptors. The conductivity of the resulting composition of matter can be further enhanced by protonic doping.

BRIEF DESCRIPTION OF THE DRAWINGS

FIG. 2 shows formation of a charge transfer complex of polyaniline and electron-accepting molecule exemplified by TCNQ.

BRIEF DESCRIPTION OF THE PREFERRED EMBODIMENTS

Figure 1A:
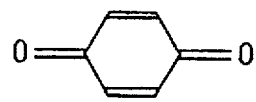
FIGS. 1a, b, c, d and e show the following examples of electron accepting molecules of the present invention: aromatic quinones, such as benzoquinone and naphthoquinone (1a and 1b, respectively), and their ring-substituted derivatives, such as alkyl, halogen and cyano substituted derivatives (1c, 1d, and 1e, respectively).
Figure 1B:
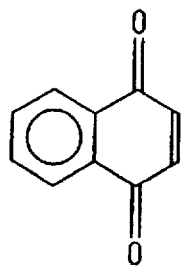
Figure 1C:
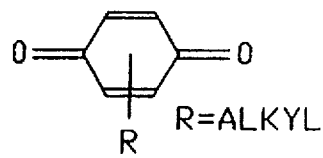
Figure 1D:
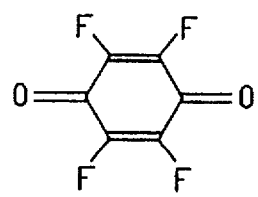
Figure 1E:
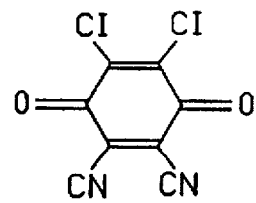

In order to facilitate understanding of the present invention, reference is made to the following detailed description taken in conjunction with the above described drawings.

The following examples include best and various modes of preparation and composition of the conductive polymer of the present invention:

The electrically conducting polymers of the present invention include polyanilines and substituted polyanilines, combinations thereof and blends thereof with other polymers and copolymers of the monomers thereof. Other polymers of the present invention include copolymers of aniline and other substituted or unsubstituted aromatic amines. In one form, polyaniline is in the emeraldine oxidation state. Polyaniline may also be in the protoemeraldine oxidation state which is a more reduced form of emeraldine. The conductivity of these materials is increased by exposing them to a suitable organic electron-accepting molecules. In particular, according to the present invention, charge transfer complexes of EB polyaniline and electron-accepting molecules are obtained whose conductivities an easily be controlled anywhere from about $10^{-7}$ to about 50 S/cm by the choice of a particular electron acceptor and/or processing solvent. In another embodiment of this invention, charge transfer salts of PANI with electron accepting molecules which have been formed by addition of less than equimolar amount of the later to polyaniline, can further be doped by treatment of the salt with protonic acids to increase the conductivity.

Examples of electron acceptors include aromatic equinones, especially substituted or unsubstituted benzoquinones or naphthoquinones. The quinone may be an alkyl, alkoxy, hydroxy, halo or cyano substituted benzoquinone or naphthoquinone or combinations thereof. Preferably the organic electron acceptor is tetracyanoquinodimethane (TCNQ).

Examples of inorganic and organic acid dopants used in this method are, hydrochloric acid, benzenesulfonic and camphor sulfonic acid. Other examples of acid dopants are sulfuric, trifluoroacetic and toluene sulfonic acid.

The reaction steps of the formation of the conductive polymer of the present invention are summarized in FIG. 2.

It is suggested that the electrical conductivity of polyaniline, as is the case for all other conjugated polymers, depends on the delocalization of unpaired electrons (or holes) across the polymer chain (intrachain conductivity) as well as between two chains (interchain conductivity). Ordinarily, when polyaniline is doped with a protonic acid, polarons, or bipolarons, which are responsible for carrying the electrical charge, can move freely along one chain. This hopping mechanism has been suggested also for movement of electrical charges between chains. The hopping mechanism is made much easier if the polymer is crystalline, or if there is a "stepping-stone" for charge carriers between two chains of the polymer. Complexation of polyaniline with certain electron-accepting molecules may achieve both the objective of increasing the crystallinity of the polyaniline and building "stepping-stones" for charge carriers through delocalizable pi electrons of the electron-accepting complexing agent.

Electrically conductive, charge transfer complexes (CTC) of polyaniline with electron acceptors can be achieved by immersion of a thin film of polyaniline emeraldine base on a substrate into a solution of electron acceptor in an organic solvent or water. In this case, the rate of the complexation (doping) of EB PANI is dependent on the electron affinity (reduction potential) of the molecule as well as the polarity of the solvent.

The charge transfer complex may be doped with a protonic acid and then further blended with an engineering resin.

Alternatively, PANI CTC's can be prepared by simply mixing a solution of EB PANI in NMP with a solution of electron acceptor and stirring at room temperature for a few hours. The CTC is isolated by precipitation in water or common organic solvents such as methanol, THF, etc.

EXAMPLE I

Figure 3:
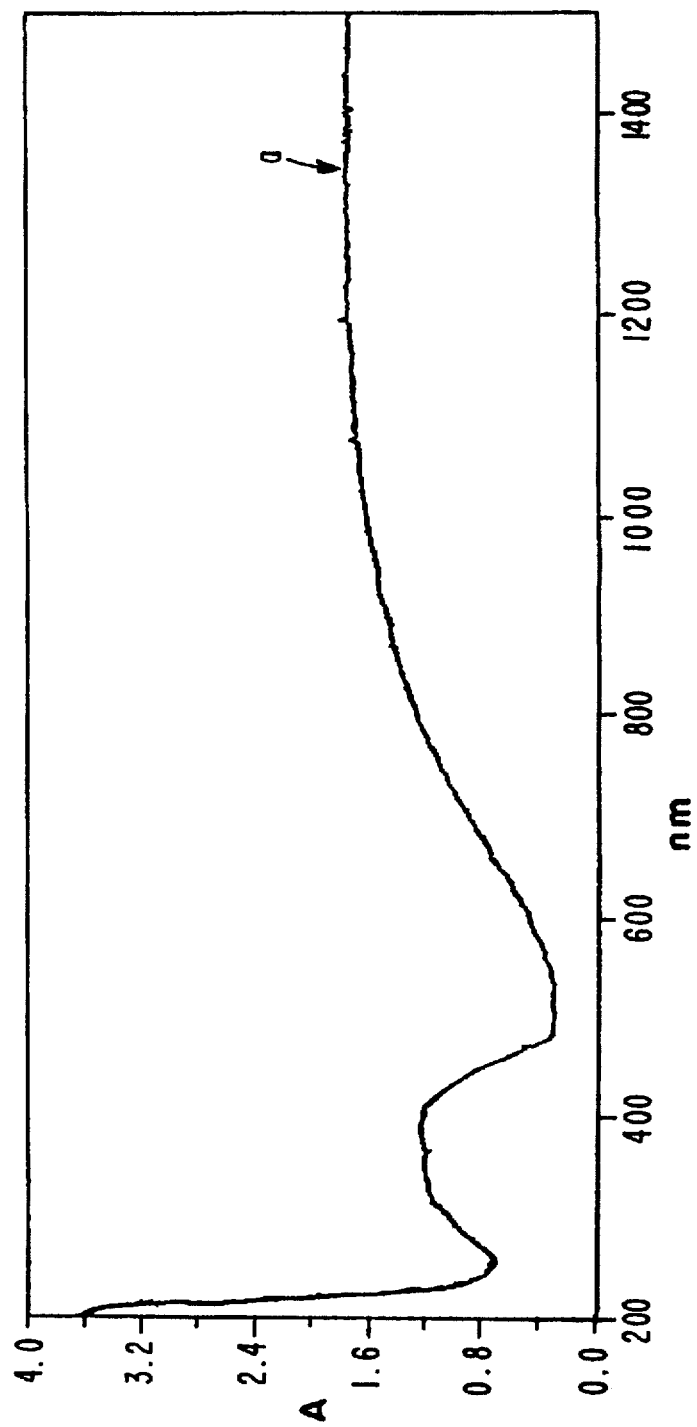
FIG. 3 shows UV-Visible spectrum of PANI-TCNQ charge transfer complex.
Figure 4:
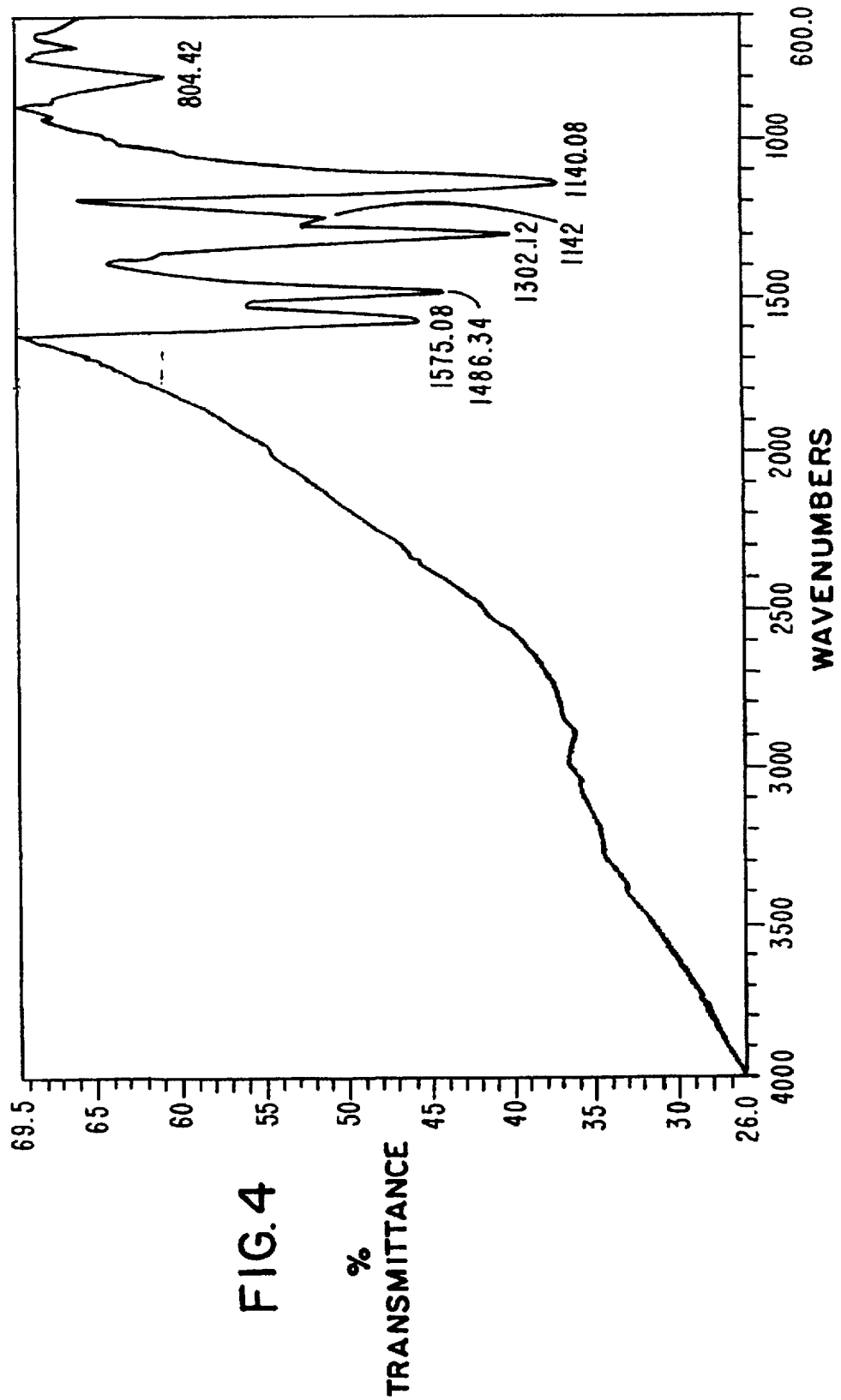
FIG. 4 shows IR spectrum of PANI-TCNQ charge transfer complex.

The emeraldine base of polyaniline (EB PANI) was prepared by the method of MacDiarmid et al. (*Synthetic Metals*, Vol. 13, p. 193, 1986). Thin films (about 250 nm) of PANI were prepared by spin coating from a solution of PANI in 1-methyl-2-pyrrolidone (NMP) and dried on a hot plate at about 90 degrees C. for about 15 minutes. The resultant films we were then immersed in 0.05 Molar solution of TCNQ (FIG. 3) in 9:1 acetonitrile-NMP at room temperature. The progress of the formation of charge-transfer complexes (CTCs) was monitored by UV-VIS spectra at different time intervals. After about 18 hours when there was no detectable change in UV-Vis absorption spectrum, the sample was withdrawn from the solution and rinsed with acetonitrile, and dried in vacuum oven. The conductivity of this CTC samples was 50 S/cm as measured by a four-point probe instrument.

EXAMPLE II

A solution of benzoquinone (216 mg; 2 mmole) in 5 mL of 1-methyl-2-pyrrolidone (NMP) was added dropwise to a solution of PANI (364 mg; 1 mmole) in 5 mL of NMP. After completion of addition, the solution was stirred at room temperature for 5 hours and the resulting solution was added to 100 mL of methanol with vigorous stirring. The precipitate was filtered, washed with copious amount of water and then methanol and dried in vacuum oven. The pressed pellet of the powder showed electrical conductivity of about 2.5 S/cm. Thermogravimetric analysis of the above powder showed that the weight loss below 250 degrees C. is negligible as compared to about 15% weight loss for acid (hydrochloric or camphor sulfonic)-doped polyaniline.

EXAMPLE III

A 50 micrometer thick film of EB PANI (prepared by pouring 10 mL of a 4% solution of PANI in NMP into a petri dish and evaporating the solvent at 70° C. in vacuum oven overnight) was immersed in a 0.05 molar solution of tetrachlorobenzoquinone in 9:1 acetonitrile-NMP mixed solvent for 24 hours. The film was removed from the solution and rinsed with acetonitrile several times and dried. The four-point probe conductivity of the partially formed charge transfer salt was about $10^{-3}$ S/cm. The above film was immersed in 1M hydrochloric acid overnight, rinsed with water and dried in vacuum oven. The conductivity of the doped polyaniline was increased to 46 S/cm.

The above examples clearly show the different approaches and the use of a variety of electron-accepting molecules to prepare electrically conductive charge transfer salts of polyaniline. In all cases the doped PANI has higher conductivity and thermal stability as compared to PANI doped with conventional protonic acids.

It is understood that the invention may be embodied in modifications of the specific examples without departing from the spirit or central characteristics thereof. The aforementioned examples and embodiments are therefore to be considered in all respects as illustrative rather than restrictive, and the invention is not to be limited to the details given herein.

What is claimed is:

1. A composition of matter comprising: polymer comprising the emeraldine base form of polyaniline; an organic electron-acceptor, wherein said electron-acceptor is selected from the group consisting of unsubstituted and ring-substituted benzoquinones, unsubstituted and ring-substituted naphthoquinones, and tetracyanoquinodimethane; and a protonic acid dopant.

2. The composition of matter described in claim 1, where said polyaniline is a homopolymer of aniline.

3. The composition of matter described in claim 1, wherein the polyaniline is a co-polymer of aniline and other substituted or unsubstituted aromatic amines.

4. The composition of matter described in claim 1, wherein the organic electron acceptor is selected from the group consisting of ring-substituted benzoquinones, unsubstituted benzoquinone, ring-substituted naphthoquinone and unsubstituted naphthoquinone.

5. The composition of matter described in claim 4, wherein the organic electron acceptor is selected from the group consisting of: alkyl, alkoxy, hydroxy, halo and cyano ring-substituted benzoquinones and alkyl, alkoxy, hydroxy, halo and cyano ring-substituted naphthoquinones and combinations thereof.

6. The composition of matter described in claim 1, wherein the organic electron acceptor is tetracyanoquinodimethane (TCNQ).

7. The composition of matter described in claim 1, wherein the organic electron acceptor combined with polyaniline comprise a charge transfer complex (CTC).

8. The composition of matter described in claim 1, wherein the protonic acid dopant is selected from the group consisting of hydrochloric, sulfuric, trifluoroacetic, benzenesulfonic toluenesulfonic and camphorsulfonic acids.

9. A composition of matter comprising: polyaniline in the protoemeraldine oxidation state; an organic electron acceptor which is selected from the group consisting of unsubstituted and ring-substituted benzoquinones, unsubstituted and ring-substituted naphthoquinones, and tetracyanoquinodimethane; and a protonic acid dopant.

10. A method of making a charge-transfer complex, comprising the steps of: combining the emeraldine base form of polyaniline with an organic electron-acceptor to form a charge transfer complex wherein said electron acceptor is selected from the group consisting of unsubstituted and ring-substituted benzoquinones, unsubstituted and ring-substituted naphthoquinones, and tetracyanoquinodimethane; and a protonic acid dopant.

11. The method described in claim 10 further comprising blending the charge transfer complex with an engineering resin.

* * * * *

UNITED STATES PATENT AND TRADEMARK OFFICE
CERTIFICATE OF CORRECTION

PATENT NO. : 5,776,370
DATED : July 7, 1998
INVENTOR(S) : Afzali-Ardakani, et al.

It is certified that error appears in the above-indentified patent and that said Letters Patent is hereby corrected as shown below:

Column 3, line 27: "TCNQ" should read as --DDQ--

Column 6, line 39, Claim 10: "and a" should read --doping said charge transfer complex with--.

Signed and Sealed this

Fourteenth Day of December, 1999

Attest:

Attesting Officer

Q. TODD DICKINSON

Acting Commissioner of Patents and Trademarks